United States Patent
Song et al.

(10) Patent No.: US 7,349,274 B2
(45) Date of Patent: Mar. 25, 2008

(54) PRECHARGE CIRCUIT AND METHOD EMPLOYING INACTIVE WEAK PRECHARGING AND EQUALIZING SCHEME AND MEMORY DEVICE INCLUDING THE SAME

(75) Inventors: Tae-joong Song, Hwaseong-si (KR); Young-keun Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/706,761

(22) Filed: Feb. 15, 2007

(65) Prior Publication Data

US 2007/0140027 A1 Jun. 21, 2007

Related U.S. Application Data

(62) Division of application No. 10/999,402, filed on Nov. 30, 2004, now Pat. No. 7,203,110.

(30) Foreign Application Priority Data

Dec. 3, 2003 (KR) .............................. 2003-87251

(51) Int. Cl.
*G11C 7/00* (2006.01)
*G11C 11/00* (2006.01)
*G11C 5/06* (2006.01)

(52) U.S. Cl. .................. 365/203; 365/154; 365/156; 365/63; 365/191

(58) Field of Classification Search ................ 365/154, 365/203
See application file for complete search history.

(56) References Cited

U.S. PATENT DOCUMENTS

| | | | |
|---|---|---|---|
| 4,656,608 A * | 4/1987 | Aoyama ..................... 365/190 |
| 4,658,381 A | 4/1987 | Reed et al. | |
| 4,817,057 A * | 3/1989 | Kondo et al. ............... 365/203 |
| 4,856,106 A * | 8/1989 | Teraoka ..................... 365/203 |
| 4,980,864 A * | 12/1990 | Fukuhama et al. ......... 365/206 |
| 5,121,357 A | 6/1992 | Wiedmann et al. | |
| 5,305,268 A * | 4/1994 | McClure ..................... 365/203 |
| 5,325,335 A * | 6/1994 | Ang et al. .................. 365/205 |
| 5,499,216 A * | 3/1996 | Yamamoto ............. 365/230.03 |
| 5,499,218 A * | 3/1996 | Ahn et al. ............. 365/230.06 |
| 5,589,699 A * | 12/1996 | Araki ......................... 257/316 |

(Continued)

FOREIGN PATENT DOCUMENTS

JP 4228184 8/1992

(Continued)

*Primary Examiner*—Ly Duy Pham
(74) *Attorney, Agent, or Firm*—Mills & Onello LLP

(57) ABSTRACT

Disclosed are a precharge circuit employing an inactive weak precharging and equalizing scheme, a memory device including the same and a precharging method. The inactive weak precharging and equalizing scheme equalizes a non-selected bit line and complementary bit line while sensing and amplifying memory cell data delivered to a selected bit line and complementary bit line to evaluate the voltage difference between the selected bit line and complementary bit line. Then, the scheme precharges the selected bit line and complementary bit line and the non-selected bit line and complementary bit line. This does not require high precharge driving capability for inactivated bit line and complementary bit line equalized to a predetermined voltage level so that precharge current and operating current can be reduced.

5 Claims, 5 Drawing Sheets

U.S. PATENT DOCUMENTS

| | | | |
|---|---|---|---|
| 5,712,824 A * | 1/1998 | Uchihira | 365/203 |
| 5,724,292 A * | 3/1998 | Wada | 365/207 |
| 5,818,773 A | 10/1998 | Takahashi | |
| 5,828,610 A | 10/1998 | Rogers et al. | |
| 5,883,846 A * | 3/1999 | Lee | 365/207 |
| 5,963,470 A | 10/1999 | Sato | |
| 6,075,733 A | 6/2000 | Brown | |
| 6,909,648 B2 * | 6/2005 | Terzioglu et al. | 365/201 |
| 2002/0075721 A1 * | 6/2002 | Osada et al. | 365/154 |
| 2002/0172070 A1 | 11/2002 | Arimoto et al. | |
| 2002/0176291 A1 * | 11/2002 | Cheung et al. | 365/200 |
| 2003/0007413 A1 * | 1/2003 | Kodaira et al. | 365/233 |
| 2003/0021168 A1 * | 1/2003 | Ishida et al. | |
| 2003/0026124 A1 | 2/2003 | Nagaoka | |
| 2003/0112668 A1 * | 6/2003 | Takahashi et al. | 365/200 |
| 2003/0191974 A1 * | 10/2003 | Kato et al. | 713/300 |
| 2005/0135169 A1 | 6/2005 | Somasekhar et al. | |

FOREIGN PATENT DOCUMENTS

| | | |
|---|---|---|
| JP | 7-211073 | 8/1995 |
| JP | 10144077 | 5/1998 |
| KR | 1998-080431 | 11/1998 |

* cited by examiner

PRECHARGE CIRCUIT AND METHOD EMPLOYING INACTIVE WEAK PRECHARGING AND EQUALIZING SCHEME AND MEMORY DEVICE INCLUDING THE SAME

RELATED APPLICATIONS

This application is a divisional of U.S. application Ser. No. 10/999,402, filed on Nov. 30, 2004 now U.S. Pat. No. 7,203,110, which relies for priority upon Korean Patent Application No. 10-2003-0087251, filed on Dec. 3, 2003, the contents of which are herein incorporated by reference in their entirety.

BACKGROUND OF THE INVENTION

This application claims the priority of Korean Patent Application No. 2003-87251, filed on Dec. 3, 2003, in the Korean Intellectual Property Office, the contents of which are incorporated herein in their entirety by reference.

1. Field of the Invention

The present invention relates to a semiconductor memory device and, more particularly, to a memory device employing an inactive weak precharging and equalizing scheme and a precharging method to reduce peak current.

2. Description of the Related Art

The power consumption of a semiconductor memory device is determined by an operating current flowing between a power supply voltage VDD supplied from the outside and a ground voltage VSS. The operating current I produces a predetermined IR drop caused by a resistance component R of a power line through which the power supply voltage VDD is transferred, that is, a voltage drop. In addition, the operating current brings about a predetermined IR rise, i.e., a voltage rise, due to a resistance component R of a power line through which the ground voltage VSS is transferred. This voltage drop or voltage rise on the power line serves as a load when power is provided to a semiconductor memory device.

One method for reducing the power load is to decrease the resistance R of the power line. Specifically, a thick power line is employed for the memory device and this power line is connected in close proximity to a power tab entering the memory device. However, this method reduces a voltage drop occurring inside the memory device but it cannot decrease a voltage drop generated when power is supplied from an external power supply to the memory device. To reduce the voltage drop generated during power supply from the external power supply to the memory device, the operating current I should be decreased.

The second method for reducing the power load is to reduce the operating current I of the memory device. The operating current I corresponds to the sum of instantaneous currents of a plurality of blocks in the memory device. Peak current that causes maximum voltage drop or voltage rise is generated during a precharge cycle of the memory device. This is because large precharge transistors designed to remove the timing loss of the precharge cycle simultaneously operate for each column. This precharge operation is described with reference to FIG. 1.

Referring to FIG. 1, a memory device 100 includes a memory cell block 110, a first precharge block 120, a column selector 130, a second precharge block 140, a precharge driver 150, a write driver 160, and a data input/output circuit 170. Memory cells 111, 112, 113 and 114 connected to wordlines WL0, . . . , WLn are connected to bit lines and complementary bit lines BL0, /BL0, BLm and /BLm. The bit lines and complementary bit lines BL0, /BL0, BLm and /BLm in the memory cell block 110 are selectively connected to the input/output circuit 170 through the column selector 130 so that data of selected memory cells 111,112, 113 and 114 is inputted and outputted through the data input/output circuit 170.

When the memory cells 111, 112, 113 and 114 are not accessed, transistors 121a-121c, 122a-122c and 140a-140c in the first and second precharge blocks 120 and 140 are turned on in response to the output of the precharge driver 150 that delivers a precharge signal PRECHARGE to precharge the bit lines and complementary bit lines BL0, /BL0, BLm and /BLm. That is, the bit lines and complementary bit lines BL0, /BL0, BLm and /BLm are precharged by the first precharge block 120 located in close proximity to the memory cell block 110 and, at the same time, the bit lines and complementary bit lines BL0, /BL0, BLm and /BLm are precharged by the second precharge block 140 adjoining the data input/output circuit 170 including a sense amplifier (not shown). This rapidly precharges the bit lines and complementary bit lines BL0, /BL0, BLm and /BLm to raise sensing speed. However, this method increases the precharge current, which induces a peak current of the memory device.

A method of reducing the peak current generated during the precharge operation is disclosed in U.S. Pat. No. 6,075,733. Referring to FIG. 2, the circuit construction of U.S. Pat. No. 6,075,733 includes a first precharge circuit 12 for precharging bit lines 16 and 18 and a second precharge circuit 14 for precharging the bit lines 16 and 18 before the first precharge circuit 12 precharges them during a memory operation. The size of transistors 22 of the first precharge circuit 12 is larger than that of transistors 20 of the second precharge circuit 14 (X>Y).

With this circuit construction, the bit lines 16 and 18 are precharged by the second precharge circuit 14 whose drive intensity and current are smaller than those of the first precharge circuit. Then, the bit lines 16 and 18 are finally precharged by the first precharge circuit 12 so as to reduce the peak current. However, this two-step precharging method requires a predetermined period of time for precharging the bit lines 16 and 18.

Accordingly, a precharging method capable of decreasing power consumption while reducing bit line precharge time is needed.

SUMMARY OF THE INVENTION

The present invention provides a precharging method that weak-precharges and equalizes bit lines that are inactivated while activated bit lines are accessed.

The present invention further provides a precharge circuit for executing the precharging method.

The present invention further provides a memory device including a weak precharge circuit and a strong precharge circuit.

According to an aspect of the present invention, there is provided a precharging method, comprising the steps of sensing and amplifying memory cell data delivered to a selected bit line and complementary bit line pair, to evaluate the voltage difference between the bit line and complementary bit line; equalizing a non-selected bit line-complementary bit line pair; and precharging the selected bit line-complementary bit line pair and the non-selected bit line-complementary bit line pair.

In one embodiment, the non-selected bit line-complementary bit line pair is equalized through a PMOS transistor that is connected between the bit line and complementary bit line and responds to a column decoding signal for selecting the bit line-complementary bit line pair and a precharge signal.

In one embodiment, the selected bit line-complementary bit line pair and the non-selected bit line-complementary bit line pair are precharged to a power supply voltage level through PMOS transistors connected to the power supply voltage and each of the selected bit line-complementary bit line pair and the non-selected bit line-complementary bit line pair and the gates of the PMOS transistors are connected to the precharge signal.

In one embodiment, the selected bit line-complementary bit line pair and the non-selected bit line-complementary bit line pair are precharged to the power supply voltage level through first PMOS transistors connected to the power supply voltage and each of the selected bit line-complementary bit line pair and the non-selected bit line-complementary bit line pair and a second PMOS transistor connected between each bit line and its complementary bit line, and the gates of the first and second PMOS transistors are connected to the precharge signal.

According to another aspect of the present invention, there is provided a precharging method, comprising the steps of precharging a read bit line and complementary read bit line connected to a sensing circuit and then canceling the precharge; transmitting data of memory cells connected to a predetermined enabled wordline to a selected bit line and complementary bit line; sensing and amplifying the memory cell data transmitted to the selected bit line and complementary bit line through the sensing circuit, to evaluate the voltage difference between the bit line and complementary bit line, and then transmitting the memory cell data to the read bit line and complementary read bit line; equalizing the memory cell data delivered to a non-selected bit line and complementary bit line through a weak equalizing transistor; and precharging the selected bit line and complementary bit line, the non-selected bit line and complementary bit line, and the read bit line and complementary read bit line in response to a precharge signal.

In one embodiment, the non-selected bit line and complementary bit line are equalized through a PMOS transistor that is connected between the bit line and complementary bit line and responds to a column decoding signal for selecting the bit line and complementary bit line and a precharge signal.

In one embodiment, the non-selected bit line and complementary bit line are equalized to a voltage level lower than power supply voltage.

In one embodiment, the size of transistors for precharging the selected and non-selected bit lines and complementary bit lines is smaller than that of transistors for precharging the read bit line and complementary read bit line.

In one embodiment, each of the selected bit line-complementary bit line pair, the non-selected bit line-complementary bit line pair and the read bit line-complementary read bit line pair is precharged to a power supply voltage level through PMOS transistors connected to the power supply voltage and each of the selected bit line-complementary bit line pair, the non-selected bit line-complementary bit line pair and the read bit line-complementary read bit line pair, the gate of each of the PMOS transistors being connected to the precharge signal.

According to another aspect of the present invention, there is provided a precharge circuit, comprising a first PMOS transistor connected between a bit line and power supply voltage, the gate of the first PMOS transistor being connected to a precharge signal; a second PMOS transistor connected between a complementary bit line and the power supply voltage, the gate of the second PMOS transistor being connected to the precharge signal; and a third PMOS transistor connected between the bit line and the complementary bit line, the gate of the third PMOS transistor being connected to a weak equalizing signal that represents that the bit line and the complementary bit line have been non-selected.

According to another aspect of the present invention, there is provided a precharge circuit, comprising a first PMOS transistor connected between a bit line and power supply voltage, the gate of the first PMOS transistor being connected to a precharge signal; a second PMOS transistor connected between a complementary bit line and the power supply voltage, the gate of the second PMOS transistor being connected to the precharge signal; a third PMOS transistor connected between the bit line and the complementary bit line, the gate of the third PMOS transistor being connected to the precharge signal; and a fourth PMOS transistor connected between the bit line and the complementary bit line, the gate of the fourth PMOS transistor being connected to a weak equalizing signal that represents that the bit line and the complementary bit line have been non-selected.

According to another aspect of the present invention, there is provided a precharge circuit, comprising a strong precharger for precharging a bit line and complementary bit line during a precharge operation; and a weak precharger for equalizing a non-selected bit line and complementary bit line during a normal operation and precharging the bit line and complementary bit line during the precharge operation.

In one embodiment, the size of transistors of the weak precharger is smaller than that of transistors of the strong precharger.

In one embodiment, the strong precharger includes: a first PMOS transistor connected between the bit line and a power supply voltage, the gate of the first PMOS transistor being connected to a precharge signal; a second PMOS transistor connected between the complementary bit line and the power supply voltage, the gate of the second PMOS transistor being connected to the precharge signal; and a third PMOS transistor connected between the bit line and the complementary bit line, the gate of the third PMOS transistor being connected to the precharge signal.

In one embodiment, the weak precharger includes: a first PMOS transistor connected between the bit line and power supply voltage, the gate of the first PMOS transistor being connected to the precharge signal; a second PMOS transistor connected between the complementary bit line and the power supply voltage, the gate of the second PMOS transistor being connected to the precharge signal; and a third PMOS transistor connected between the bit line and the complementary bit line, the gate of the third PMOS transistor being connected to a weak equalizing signal that represents that the bit line and the complementary bit line have been non-selected.

In one embodiment, the weak precharger includes: a first PMOS transistor connected between the bit line and a power supply voltage, the gate of the first PMOS transistor being connected to the precharge signal; a second PMOS transistor connected between the complementary bit line and the power supply voltage, the gate of the second PMOS transistor being connected to the precharge signal; a third PMOS transistor connected between the bit line and the complementary bit line, the gate of the third PMOS transistor being connected to the precharge signal; and a fourth PMOS transistor connected between the bit line and the complementary bit line, the gate of the fourth PMOS transistor being connected to a weak equalizing signal that represents that the bit line and the complementary bit line have been non-selected.

According to another aspect of the present invention, there is provided a memory device, comprising a memory cell block in which a plurality of memory cells are arranged; bit lines and complementary bit lines to which data of the memory cells connected to a predetermined enabled wordline is delivered; a column selector for transmitting data on a selected bit line and complementary bit line to a read bit line and complementary read bit line; a weak precharger for equalizing a non-selected bit line and complementary bit line; a sensing circuit for sensing the memory cell data that has been delivered to the read bit line and complementary read bit line; and a strong precharger for precharging the read bit line and complementary read bit line.

In one embodiment, the weak precharger includes: a first PMOS transistor connected between a bit line and the power supply voltage, the gate of the first PMOS transistor being connected to a precharge signal; a second PMOS transistor connected between a complementary bit line and the power supply voltage, the gate of the second PMOS transistor being connected to the precharge signal; and a third PMOS transistor connected between the bit line and the complementary bit line, the gate of the third PMOS transistor being connected to a weak equalizing signal that represents that the bit line and the complementary bit line have been non-selected.

In one embodiment, the weak precharger includes: a first PMOS transistor connected between a bit line and power supply voltage, the gate of the first PMOS transistor being connected to a precharge signal; a second PMOS transistor connected between a complementary bit line and the power supply voltage, the gate of the second PMOS transistor being connected to the precharge signal; a third PMOS transistor connected between the bit line and the complementary bit line, the gate of the third PMOS transistor being connected to the precharge signal; and a fourth PMOS transistor connected between the bit line and the complementary bit line, the gate of the fourth PMOS transistor being connected to a weak equalizing signal that represents that the bit line and the complementary bit line have been non-selected.

In one embodiment, the strong precharger includes: a first PMOS transistor connected between the read bit line and power supply voltage, the gate of the first PMOS transistor being connected to a precharge signal; a second PMOS transistor connected between the complementary bit line and the power supply voltage, the gate of the second PMOS transistor being connected to the precharge signal; and a third PMOS transistor connected between the read bit line and complementary read bit line, the gate of the third PMOS transistor being connected to the precharge signal.

Accordingly, inactivated bit lines and complementary bit lines are equalized through equalizing transistors while data on an activated bit line and complementary bit line is sensed and amplified to evaluate the voltage difference between the bit line and complementary bit line. This does not require high precharge driving capability for the inactivated bit line and complementary bit line equalized to a predetermined voltage level so that precharge current and operating current can be reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
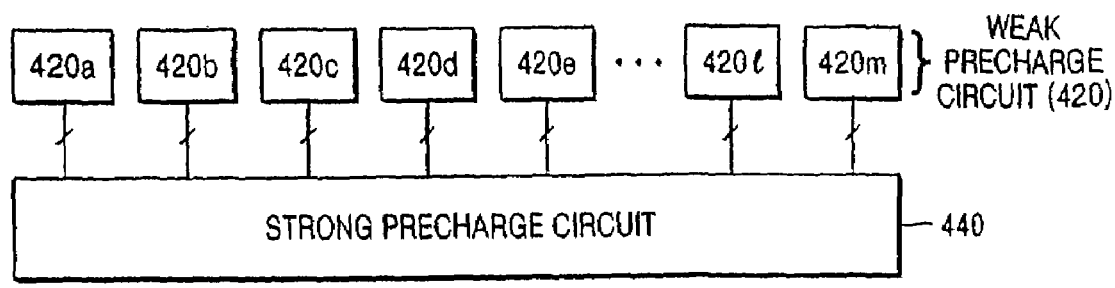
FIG. 3 is a diagram illustrating a precharging method according to the present invention.

FIG. 3 is a diagram illustrating a precharging method in accordance with an embodiment of the present invention. Referring to FIG. 3, the present invention is composed of a weak precharge circuit 420 and a strong precharge circuit 440. The weak precharge circuit 420 includes a plurality of circuit blocks 420a, 420b, 420c, 420d, 420e, . . . , 420m connected to each pair of bit lines and the strong precharge circuit 440 is composed of one circuit block connected to the weak precharge circuit 420.

When the mth pair of bit lines is selected and activated, the mth weak precharge block 420m is connected to the strong precharge circuit 440 to sense and amplify data of the mth pair of bit lines through a sensing circuit connected to the strong precharge circuit 440. The first through lth weak precharge blocks 420a through 420l connected to inactivated bit line pairs, i.e., bit line pairs other than the activated mth bit line pair, are not connected to the strong precharge circuit 440 and respectively equalize the inactivated bit line pairs. When the inactivated bit line pairs are equalized to a voltage level lower than the power supply voltage level VDD, which is a precharge voltage level, precharge driving capability is reduced during the following precharge operation so as to reduce the peak current of the memory device.

Figure 4:
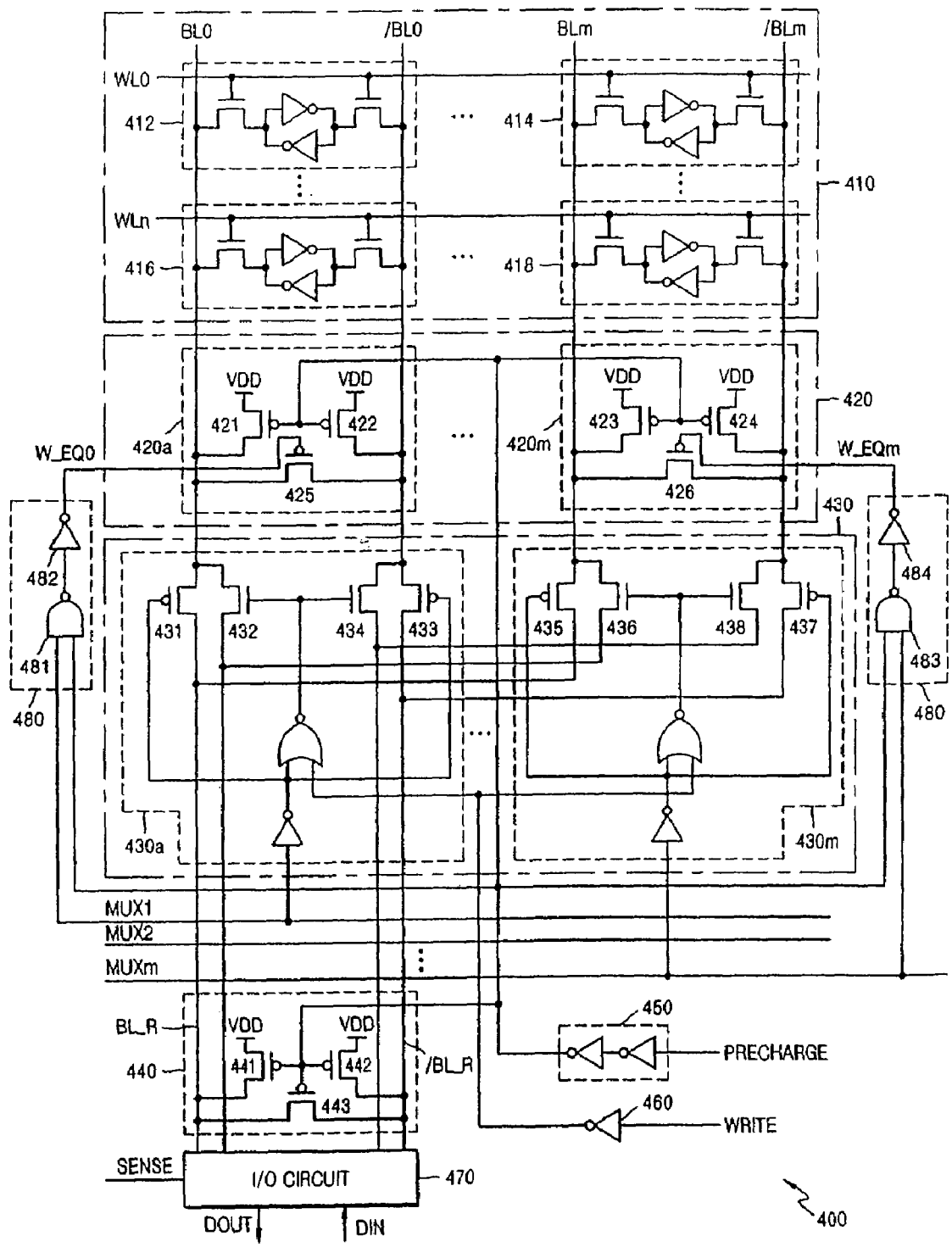
FIG. 4 is a circuit diagram of a memory device including a precharge circuit according to an embodiment of the present invention.

FIG. 4 is a circuit diagram of a memory device including a precharge circuit according to an embodiment of the present invention. Referring to FIG. 4, the memory device 400 includes a memory cell block 410, a weak precharge block 420, a column selector 430, a strong precharge block 440, a precharge driver 450, a write driver 460, a data input/output circuit 470, and a weak equalizing signal generator 480. The memory device 400 is distinguished from the conventional memory device 100 shown in FIG. 1 at least by the construction and operation of the weak precharge block 420 and weak equalizing block 480. The other components 410, 430, 450, 460 and 470 are the same as those included in general memory devices and their operations are well-known to those of ordinary skill in the art. Thus, detailed descriptions of the operations of these components are omitted.

Figure 6:
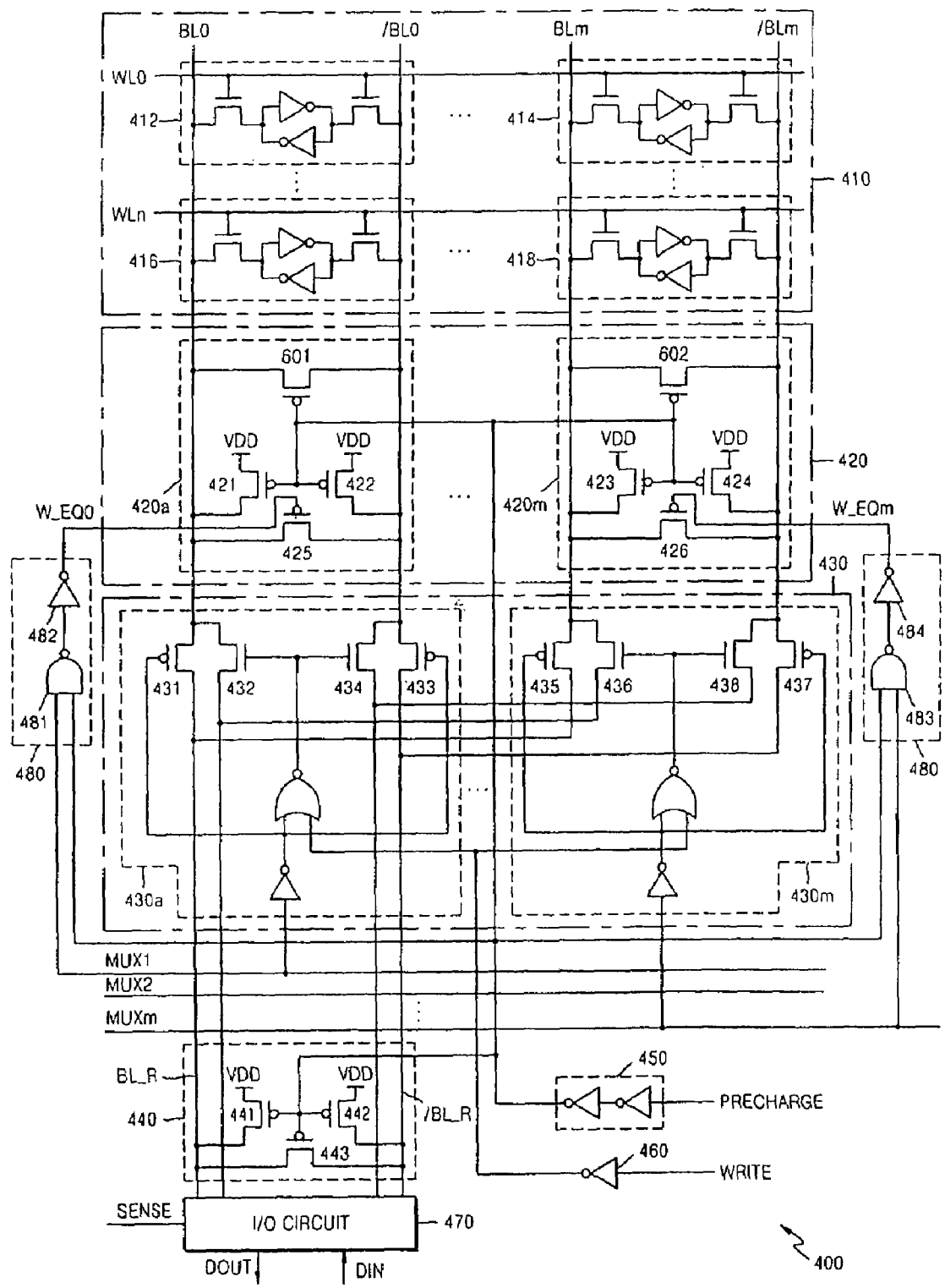
FIG. 6 is a circuit diagram of a memory device including a precharge circuit according to an alternative embodiment of the present invention.

The weak precharge block 420 includes weak precharge transistors 421, 422, 423 and 424 and equalizing transistors 425 and 426 connected to bit lines and complementary bit lines BL0 and /BL0, . . . , BLm and /BLm. While the bit line BL0 and complementary bit line /BL0 are precharged according to the weak precharge transistors 421 and 422 connected to the bit line BL0 and complementary bit line /BL0 in this embodiment, alternatively, as shown in FIG. 6, a transistor 601, 602 whose gate is connected to a precharge signal PRECHARGE can be additionally included between the bit line BL0 and complementary bit line /BL0 in order to precharge the bit line BL0 and complementary bit line /BL0.

The weak precharge transistors 421 and 422 are connected between the power supply voltage VDD and the first bit line BL0 and the first complementary bit line /BL0, respectively, and their gates are connected to a precharge signal PRECHARGE transmitted through the precharge driver 450. The weak precharge transistors 423 and 424 are connected between the power supply voltage VDD and the mth bit line BLm and the mth complementary bit line /BLm, respectively, and their gates are connected to the precharge signal PRECHARGE delivered through the precharge driver 450.

The weak equalizing transistor 425 is connected between the first bit line BL0 and the first complementary bit line /BL0 and its gate is connected to a first weak equalizing signal generated by the weak equalizing signal generator 480. The weak equalizing transistor 426 is connected between the mth bit line BLm and the mth complementary bit line /BLm and its gate is connected to the mth weak equalizing signal provided by the weak equalizing signal generator 480.

The weak precharge transistors 421 and 422 precharge the first bit line BL0 and the first complementary bit line /BL0 to the power supply voltage level VDD in response to the precharge signal PRECHARGE. The weak precharge transistors 423 and 424 precharge the mth bit line BLm and the mth complementary bit line /BLm to the power supply voltage level VDD in response to the precharge signal PRECHARGE. Here, transistors 441, 442 and 443 of the strong precharge circuit 440 precharge a read bit line BL_R and a complementary read bit line BL_R to the power supply voltage level VDD in response to the precharge signal PRECHARGE.

The read bit line BL_R and the complementary read bit line /BL_R are respectively connected to the bit lines and complementary bit lines BL0, /BL0, BLm and /BLm of the memory cell block 410 through transistors 431, 433, 435 and 437 of the column selector 430. Memory cell data delivered to the read bit line and complementary read bit line is sensed and amplified through a sensing circuit (not shown) in the data input/output circuit 470.

The weak equalizing transistor 425 equalizes the first bit line BL0 and the first complementary bit line /BL0 to the same voltage level in response to the first weak equalizing signal W_EQ0. The weak equalizing transistor 426 equalizes the mth bit line BLm and the mth complementary bit line /BLm to the same voltage level in response to the mth weak equalizing signal W_EQm. When the bit lines and complementary bit lines BL0, /BL0, BLm, and /BLm are equalized, their voltage levels before equalization. become a specific voltage level through the weak equalizing transistors 425 and 426. This specific voltage level is lower than the power supply voltage level VDD. Accordingly, the bit lines and complementary bit lines BL0, /BL0, BLm, and /BLm are weakly precharged in comparison with the precharge of the power supply voltage level VDD in the strong precharge circuit 440.

The weak equalizing signal generator 480 selectively generates the weak equalizing signals W_EQ0, . . . , W_EQm in response to the precharge signal PRECHARGE provided by the precharge driver 450 and column decoding signals MUX1, MUX2, . . . , MUXm. The first weak equalizing signal W_EQ0 is generated as a logic low level signal when the first column decoding signal MUX1 is inactivated to the logic low level to turn on the weak equalizing transistor 425. That is, the first column decoding signal MUX1 having the logic low level de-selects the first bit line pair BL0 and /BL0, which means that the inactivated first bit line pair BL0 and /BL0 is weakly precharged while being equalized through the weak equalizing transistor 425.

The mth weak equalizing signal W_EQm is generated as a logic low level signal when the mth column decoding signal MUXm is at the logic low level to turn on the weak equalizing transistor 426. Accordingly, an inactivated pair of bit lines BLm and /BLm is equalized through the weak equalizing transistor 426 and weakly precharged.

Also, the first through mth weak equalizing signals W_EQ0, . . . , W_EQm are generated as logic low level signals when the precharge signal PRECHARGE is at logic a low level to turn on the weak equalizing transistors 425 and 426. Even the weak precharge transistors 421, 422, 423 and 424 are turned on in response to the logic low level precharge signal PRECHARGE. Accordingly, the bit lines and complementary bit lines BL0, /BL0, BLm, and /BLm are precharged to the power supply voltage level VDD. In addition, the transistors 441, 442 and 443 of the strong precharge circuit 440 are turned on by the logic low level precharge signal so that the read bit line pair is precharged to the power supply voltage level VDD.

If the width to length (W/L) ratio of the weak precharge transistors 421, 422, 423 and 424 and weak equalizing transistors 425 and 426 is x and the width to length (W/L) ratio of the transistors 441, 442 and 443 of the strong precharge circuit 440 is y, the relationship of x and y is set to be x<y. Specifically, the ratio of width to length of the weak precharge transistors 421, 422, 423 and 424 and weak equalizing transistors 425 and 426 is smaller than the ratio of the width to length of the transistors 441, 442 and 443 of the strong precharge circuit 440. This is because, among components that cause power consumption during the bit line precharge operation, a load component corresponding to the gate capacitance of the precharge transistors causes more power consumption than a load component caused by the capacitance of the bit lines.

Figure 5:
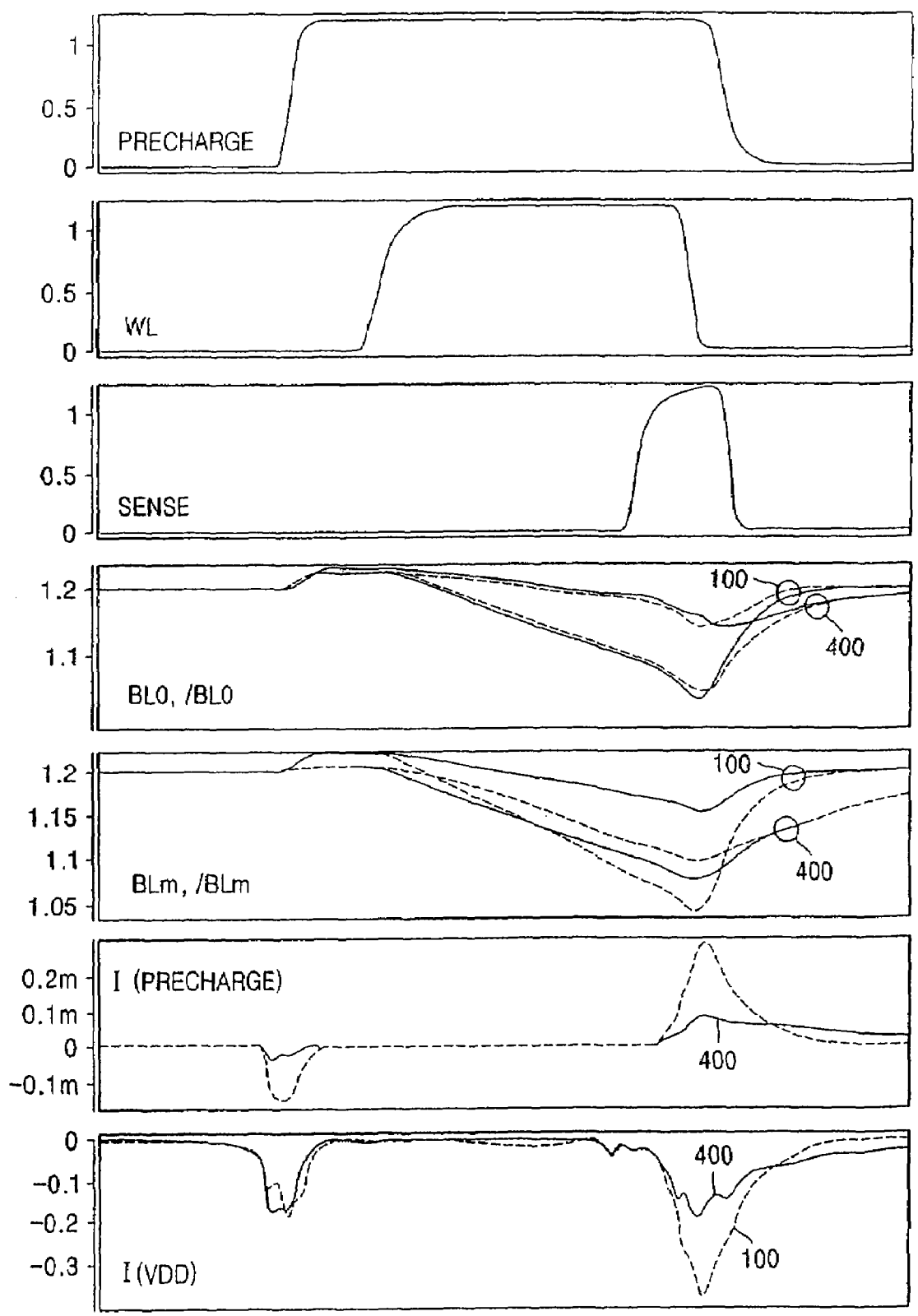
FIG. 5 is an operation timing diagram of the memory device of FIG. 4.

The operation of the memory device 400 according to the weak precharging and equalizing method of the present invention is shown in FIG. 5. Referring to FIG. 5, after the precharge signal PRECHARGE is activated from a logic low level to a logic high level, the first wordline WL0 is activated from the logic low level to the logic high level.

For convenience of description, it is assumed that the first column decoding signal MUX0 is activated to the logic high level so that data of the first memory cell 412 is transmitted to the first bit line BL0 and the first complementary bit line /BL0. Here, the other column decoding signals MUX1, . . . , MUXm are inactivated to the logic low level. Reference numeral 400 denotes the operation waveform of the memory device of the present invention and 100 represents the operation waveform of the conventional memory device 100 shown in FIG. 1.

The data of the memory cell 412, which has been delivered to the selected, i.e., activated, first bit line BL0 and first complementary bit line /BL0, is transmitted to the data input/output circuit 470 through transistors 431 and 433 of the column selector 430, and then sensed and amplified in response to a logic high level cycle of a sensing signal SENSE, to evaluate the voltage difference between the first bit line BL0 and the first complementary bit line /BL0. Here, the inactivated mth bit line BLm and mth complementary bit line /BLm are provided with data of the mth memory cell 414 as the first wordline WL0 is enabled but they maintain a nearly identical voltage level due to the weak equalizing transistor 426.

When the first bit line BL0 and the first complementary bit line /BL0 are deactivated in response to the logic low level of the precharge signal PRECHARGE, they are equalized to a voltage level lower than the power supply voltage VDD through the weak equalizing transistor 425, and the first bit line and complementary bit line BL0 and /BL0 are precharged to the power supply voltage VDD through the weak precharge transistors 421 and 422. In addition, the mth bit line BLm and the mth complementary bit line /BLm are precharged to the power supply voltage level VDD by the weak equalizing transistor 426 and weak precharge transistors 423 and 424.

Referring to the operation waveform 100 of the conventional memory device, the voltage difference between the first bit line BL0 and the first complementary bit line /BL0 is evaluated based on data of the first memory cell 112 in response to activation of the first word line and the first column decoding signal. Then, the precharge transistors 121 and 122 and equalizing transistor 125 (referring to FIG. 1) are turned on in response to activation of the precharge signal PRECHARGE to precharge the first bit line BL0 and the first complementary bit line /BL0 to the power supply voltage level VDD. The voltage difference between the mth bit line BLm and the mth complementary bit line /BLm is evaluated according to data of the mth memory cell 114 in response to the activation of the first wordline. Subsequently, the precharge transistors 123 and 124 and equalizing transistor 126 are turned on according to the activation of the precharge signal PRECHARGE so as to precharge the mth bit line BLm and the mth complementary bit line /BLm to the power supply voltage level VDD.

In the precharge operation according to the precharge signal PRECHARGE, precharge current I(precharge) depends on the voltage level of the mth bit line BLm and the mth complementary bit line /BLm that have been inactivated before the precharge operation. Precharge current I(precharge) according to the present invention in which the inactivated mth bit line BLm and mth complementary bit line /BLm are equalized to a voltage level lower than the power supply voltage VDD and then precharged to the power supply voltage level VDD is smaller than the conventional precharge current I(precharge). This is because the conventional memory device requires higher driving capability for precharging the voltage difference between the inactivate mth bit line BLm and mth complementary bit line /BLm, which has been evaluated according to the data of the mth memory cell 114, to the power supply voltage level VDD.

Figure 1:
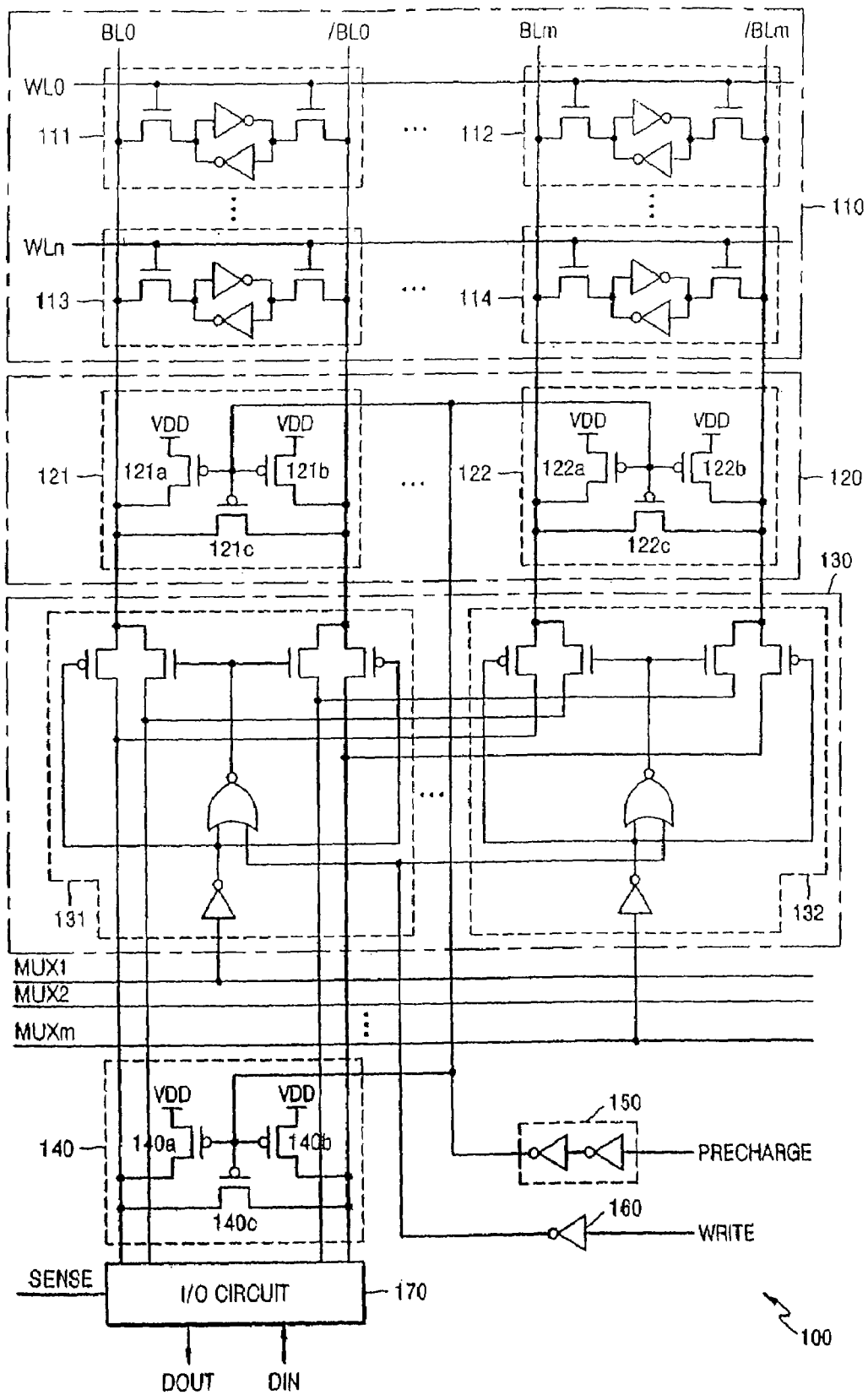
FIG. 1 is a circuit diagram of a memory device including a conventional precharge circuit.
Figure 2:
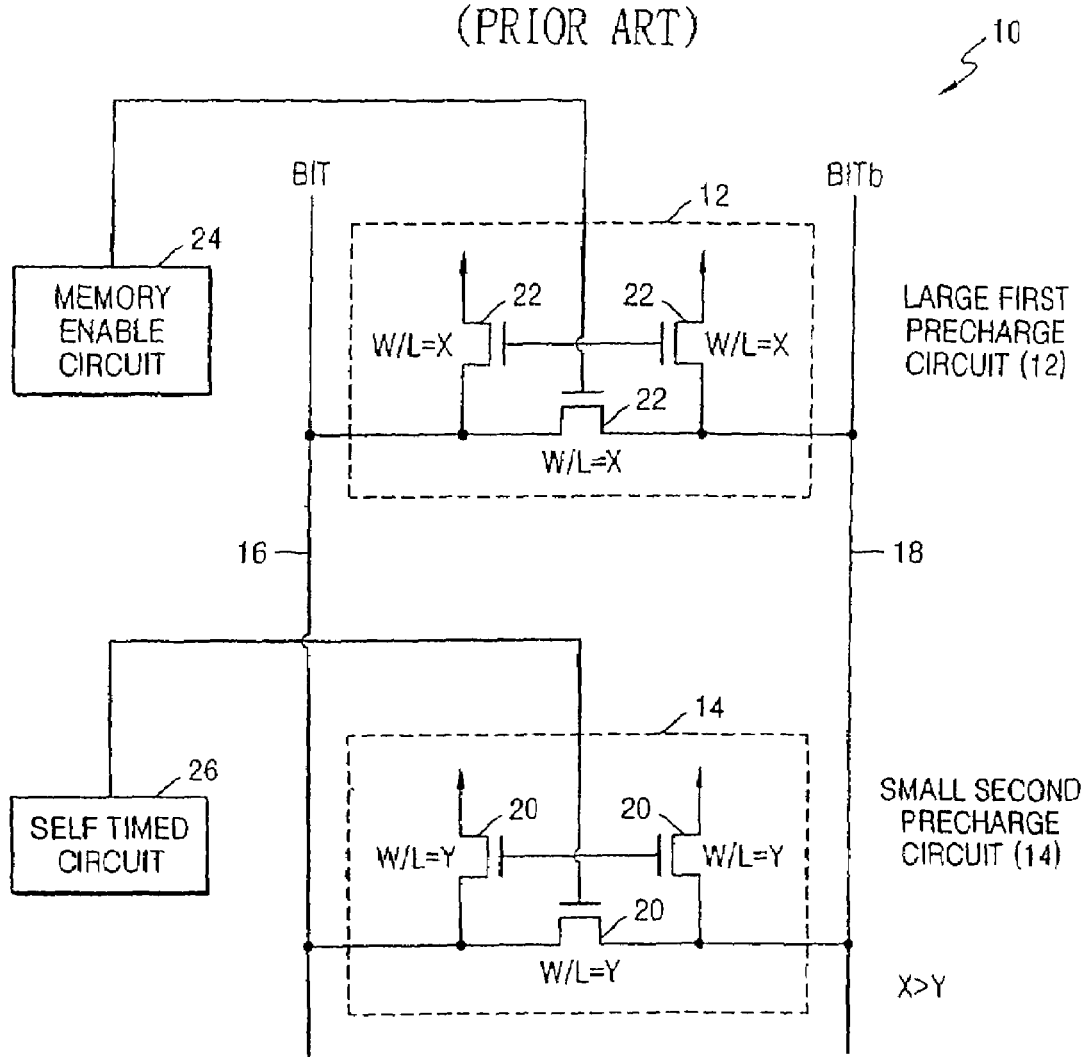
FIG. 2 is a circuit diagram of another conventional precharge circuit.

Since a reduction in the precharge current brings about a decrease in the entire operating current I (VDD) of the memory device 400, the operating current waveform of the memory device 400 according to the present invention is less than the operating current waveform of the conventional memory device 100 shown in FIG. 1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A precharge circuit, comprising:
a strong precharger for precharging a selected bit line and complementary bit line during a precharge operation; and
a weak precharger including an equalizing circuit for equalizing a non-selected bit line and complementary bit line during a normal operation in which the selected bit line and complementary bit line are sensed and amplified in a memory cell array and a precharging module for precharging the selected bit line and complementary bit line during the precharge operation, wherein the equalizing circuit receives a weak equalizing signal that represents that the bit line and complementary bit line have been non-selected regardless of a row address transition; wherein the size of transistors of the weak precharger is smaller than that of transistors of the strong precharger.

2. The precharge circuit as claimed in claim 1, wherein the strong precharger includes:
a first PMOS transistor connected between the bit line and a power supply voltage, the gate of the first PMOS transistor being connected to a precharge signal;
a second PMOS transistor connected between the complementary bit line and the power supply voltage, the gate of the second PMOS transistor being connected to the precharge signal; and
a third PMOS transistor connected between the bit line and the complementary bit line, the gate of the third PMOS transistor being connected to the precharge signal.

3. The precharge circuit as claimed in claim 1, wherein the weak precharger includes:
a first PMOS transistor connected between the bit line and power supply voltage, the gate of the first PMOS transistor being connected to the precharge signal;
a second PMOS transistor connected between the complementary bit line and the power supply voltage, the gate of the second PMOS transistor being connected to the precharge signal; and
a third PMOS transistor connected between the bit line and the complementary bit line, the gate of the third PMOS transistor being connected to the weak equalizing signal that represents that the bit line and the complementary bit line have been non-selected.

4. The precharge circuit as claimed in claim 1, wherein the weak precharger includes:
a first PMOS transistor connected between the bit line and a power supply voltage, the gate of the first PMOS transistor being connected to the precharge signal;
a second PMOS transistor connected between the complementary bit line and the power supply voltage, the gate of the second PMOS transistor being connected to the precharge signal;
a third PMOS transistor connected between the bit line and the complementary bit line, the gate of the third PMOS transistor being connected to the precharge signal; and
a fourth PMOS transistor connected between the bit line and the complementary bit line, the gate of the fourth PMOS transistor being connected to the weak equalizing signal that represents that the bit line and the complementary bit line have been non-selected.

5. A precharge circuit, comprising:

a strong precharger selected bit line and complementary bit line during a precharge operation; and a weak precharger for equalizing a non-selected bit line and complementary bit line during a normal operation selected bit line and complementary bit line during the precharge operation, wherein the weak precharger includes:

a first PMOS transistor connected between the bit line and a power supply voltage, the gate of the first PMOS transistor being connected to the precharge signal;

a second PMOS transistor connected between the complementary bit line and the power supply voltage, the gate of the second PMOS transistor being connected to the precharge signal;

a third PMOS transistor connected between the bit line and the complementary bit line, the gate of the third PMOS transistor being connected to the precharge signal; and a fourth PMOS transistor connected between the bit line and the complementary bit line, the gate of the fourth PMOS transistor being connected to a weak equalizing signal that represents that the bit line and the complementary bit line have been non-selected regardless of a row address transition and that the non-selected bit line and complementary bit line are equalized during an operation in which a selected bit line and a complementary bit line are sensed and amplified in a memory cell array.

* * * * *